United States Patent
Gong et al.

(10) Patent No.: US 12,389,678 B2
(45) Date of Patent: *Aug. 12, 2025

(54) METHOD FOR FABRICATING ARRAY SUBSTRATE

(71) Applicant: Wuhan China Star Optoelectronics Semiconductor Display Technology Co., Ltd., Hubei (CN)

(72) Inventors: Jixiang Gong, Hubei (CN); Yixian Zhang, Hubei (CN); Wenxu Xianyu, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/379,195

(22) Filed: Oct. 12, 2023

(65) Prior Publication Data

US 2024/0038787 A1 Feb. 1, 2024

Related U.S. Application Data

(63) Continuation of application No. 16/978,786, filed as application No. PCT/CN2020/097537 on Jun. 22, 2020, now Pat. No. 11,817,462.

(30) Foreign Application Priority Data

Jun. 11, 2020 (CN) .......................... 202010529346.6

(51) Int. Cl.
*H01L 29/417* (2006.01)
*H10D 30/67* (2025.01)
(Continued)

(52) U.S. Cl.
CPC ..... *H10D 86/0231* (2025.01); *H10D 30/6729* (2025.01); *H10D 86/451* (2025.01); *H10D 86/60* (2025.01); *H10D 86/423* (2025.01)

(58) Field of Classification Search
CPC . H01L 27/1288; H01L 27/12; H01L 27/1248; H01L 27/1225; H01L 27/1214;
(Continued)

(56) References Cited

U.S. PATENT DOCUMENTS

| 8,916,424 B2* | 12/2014 | Isobe | H01L 29/517 |
| | | | 438/149 |
| 10,192,891 B2* | 1/2019 | Murai | H01L 23/53295 |

(Continued)

FOREIGN PATENT DOCUMENTS

| CN | 100481512 | 4/2009 |
| CN | 104952934 | 9/2015 |

(Continued)

*Primary Examiner* — Nikolay K Yushin (57) ABSTRACT

A method for fabricating an array substrate, the array substrate, a display panel, and a thin film transistor are provided. The thin film transistor includes a gate electrode, an active layer, a source electrode, a drain electrode, and an interlayer insulating layer. The active layer is disposed corresponding to the gate electrode. The source electrode and the drain electrode are disposed at both sides of the active layer and electrically connected to the active layer. The interlayer insulating layer is disposed between the active layer and the source electrode, and between the active layer and the drain electrode. The interlayer insulating layer is provided with step-shaped contact holes. The source electrode and the drain electrode are filled in the contact holes and electrically connected to the active layer.

8 Claims, 4 Drawing Sheets

(51) Int. Cl.
*H10D 86/01* (2025.01)
*H10D 86/40* (2025.01)
*H10D 86/60* (2025.01)

(58) Field of Classification Search
CPC ..... H01L 27/124; H01L 27/127; H01L 27/00; H01L 29/41733; H01L 29/417; H01L 29/78633; H01L 29/786; H01L 29/0653; H01L 29/785; H01L 29/0603; H01L 29/0657; H01L 29/06; H01L 29/66742; A23B 45/10; A23B 45/00; A23B 2/20; A23B 2/285; A23B 2/28; A23B 2/733; A23B 11/86; A23B 11/25; A23B 11/162; H10H 20/8142; H10H 20/814; H10H 20/857; H10H 20/0364; H10F 77/937; H10F 77/00; H10F 77/484; H10F 77/334; H10F 77/50; H10F 30/222; H10F 30/20; H10F 30/00; H10D 86/0231; H10D 86/01; H10D 86/451; H10D 86/40; H10D 86/60; H10D 86/423; H10D 64/511; H10D 64/27; H10D 64/037; H10D 64/664; H10D 1/045; H10D 1/00; H10D 1/68; H10D 1/716; H10D 86/0221; H10D 86/441; H10D 30/6729; H10D 30/67; H10D 30/6723; H10D 30/031; H10D 30/01; H10D 62/10; H10D 62/822; H10D 62/121; H10D 62/118

See application file for complete search history.

(56) References Cited

U.S. PATENT DOCUMENTS

| | | | | |
|---|---|---|---|---|
| 10,797,123 | B2* | 10/2020 | Cho | H01L 27/1248 |
| 11,107,844 | B2* | 8/2021 | Je | H01L 27/1251 |
| 11,217,698 | B2* | 1/2022 | Luo | H01L 29/7869 |
| 2013/0203214 | A1* | 8/2013 | Isobe | H01L 21/425 |
| | | | | 438/104 |
| 2017/0271376 | A1* | 9/2017 | Murai | H01L 29/41733 |
| 2019/0115407 | A1* | 4/2019 | Cho | H10K 59/1213 |
| 2019/0198534 | A1* | 6/2019 | Je | H01L 27/1251 |
| 2021/0376160 | A1* | 12/2021 | Luo | H01L 27/1225 |
| 2021/0378160 | A1* | 12/2021 | Maro | A01C 7/203 |

FOREIGN PATENT DOCUMENTS

| | | |
|---|---|---|
| CN | 106571382 | 4/2017 |
| CN | 107204373 | 9/2017 |
| CN | 107819005 | 3/2018 |
| CN | 108039351 | 5/2018 |
| CN | 109148514 | 1/2019 |
| CN | 109545836 | 3/2019 |
| CN | 109755260 | 5/2019 |
| JP | 2014-082512 | 5/2014 |

* cited by examiner

METHOD FOR FABRICATING ARRAY SUBSTRATE

RELATED APPLICATIONS

This application is a Continuation of U.S. patent application Ser. No. 16/978,786 filed on Sep. 8, 2020, which application is a National Phase of PCT Patent Application No. PCT/CN2020/097537 having International filing date of Jun. 22, 2020, which claims the benefit of priority of Chinese Patent Application No. 202010529346.6 filed on Jun. 11, 2020. The contents of the above applications are all incorporated by reference as if fully set forth herein in their entirety.

FIELD AND BACKGROUND OF THE INVENTION

The present disclosure relates to the technical field of display, and particularly to a thin film transistor, an array substrate, a display panel, and a method for fabricating the array substrate.

In current organic light-emitting diode (OLED) display devices, in order to achieve low power consumption, a mainstream technology is to use low-temperature poly-silicon (LTPS) in driving thin film transistors (TFTs) and switching thin film transistors as active layers. However, LTPS has a large carrier mobility and has a problem of a high leakage current. On this basis, low temperature polycrystalline-Si oxide (LTPO) technology was developed. LTPO comprises advantages of both LTPS and metal oxides, such as indium gallium zinc oxide, and has become a solution with fast response and low power consumption. However, because LTPO uses two types of active layers at same time, a number of photomasks required in a fabricating process increases, the fabricating process is more complicated, and cost also increases.

SUMMARY OF THE INVENTION

In view of this, a purpose of the present disclosure is to provide a method for fabricating an array substrate that is simple to manufacture and low in cost, and can reduce a number of photomasks, and to provide the array substrate and a thin film transistor.

The present disclosure provides a thin film transistor, comprising:
  a gate electrode;
  an active layer disposed corresponding to the gate electrode;
  a source electrode;
  a drain electrode, wherein the source electrode and the drain electrode are disposed at both sides of the active layer and electrically connected to the active layer; and
  an interlayer insulating layer disposed between the active layer and the source electrode, and between the active layer and the drain electrode, wherein the interlayer insulating layer is provided with step-shaped contact holes, and the source electrode and the drain electrode are filled in the contact holes and electrically connected to the active layer.

In an embodiment, each of the contact holes is composed of a first contact hole and a second contact hole that communicate with each other, the first contact hole is disposed on a side of the second contact hole away from the active layer, a diameter of the first contact hole is greater than that of the second contact hole, the first contact hole has a first smooth rounded surface at its end away from the active layer, and the second contact hole has a second smooth rounded surface at its end away from the active layer.

In an embodiment, the second contact holes extend to the active layer.

In an embodiment, the thin film transistor further comprises a light-shielding layer disposed below the active layer, and a buffer layer disposed between the light-shielding layer and the active layer. The second contact holes extend through the active layer into the buffer layer.

The present disclosure further provides an array substrate comprising a substrate, a first thin film transistor, and a second thin film transistor. The first thin film transistor is disposed on the substrate and comprises: a first gate electrode; a first active layer disposed corresponding to the first gate electrode; a first source electrode; a first drain electrode, wherein the first source electrode and the first drain electrode are disposed at both sides of the first active layer and electrically connected to the first active layer; and a first interlayer insulating layer disposed between the first active layer and the first source electrode, and between the first active layer and the first drain electrode, wherein the first interlayer insulating layer is provided with step-shaped contact holes, and the first source electrode and the first drain electrode are filled in the contact holes and electrically connected to the first active layer. The second thin film transistor is disposed on the substrate and comprises: a second gate electrode; a second active layer disposed corresponding to the second gate electrode and on a side of the second active layer away from the substrate; a second source electrode; a second drain electrode, wherein the second source electrode and the second drain electrode are disposed at both sides of the second active layer and electrically connected to the second active layer; and a second interlayer insulating layer disposed between the second active layer and the first source electrode, and between the second active layer and the first drain electrode. The first drain electrode and the second source electrode are electrically connected through a first connection metal layer.

In an embodiment, the array substrate further comprises a light-shielding layer disposed between the substrate and the first thin film transistor. The first source electrode and the light-shielding layer are electrically connected through a second connection metal layer.

In an embodiment, the first active layer is made of low-temperature polysilicon, and the second active layer is made of a metal oxide semiconductor material.

In an embodiment, each of the contact holes is composed of a first contact hole and a second contact hole that communicate with each other. The first contact hole is disposed on a side of the second contact hole away from the first active layer. A diameter of the first contact hole is greater than that of the second contact hole. The first contact hole has a first smooth rounded surface at its end away from the first active layer. The second contact hole has a second smooth rounded surface at its end away from the active layer.

In an embodiment, the second contact holes extend to the first active layer.

In an embodiment, the thin film transistor further comprises a light-shielding layer disposed below the first active layer, and a buffer layer disposed between the light-shielding layer and the first active layer. The second contact holes extend through the active layer into the buffer layer.

The present disclosure further provides a method for fabricating an array substrate, comprising:

providing a first substrate comprising a substrate, a first active layer, a first interlayer insulating layer, a second active layer, and a second interlayer insulating layer, wherein the first active layer and the second active layer are disposed on the substrate, the second active layer is disposed on a side of the first active layer away from the substrate, the first interlayer insulating layer is disposed between the first active layer and the second active layer, and the second interlayer insulating layer is disposed on the second active layer;

coating a photoresist layer on the first substrate;

patterning the photoresist layer using a halftone mask, wherein first through holes are formed at positions of the photoresist layer corresponding to both sides of the first active layer, and first blind holes are formed at positions of the photoresist layer corresponding to both sides of the second active layer;

etching away the second interlayer insulating layer at positions of the first through holes to form first contact holes exposing the first interlayer insulating layer;

ashing the patterned photoresist layer, so that the first blind holes form second through holes;

etching away the first interlayer insulating layer at positions of the first contact holes to form second contact holes communicating with the first contact holes and exposing the first active layer;

etching away the second interlayer insulating layer at positions of the second through holes to form third contact holes exposing the second active layer;

removing the photoresist layer; and forming a source/drain metal layer on the second interlayer insulating layer, wherein the source/drain metal layer comprises a first source electrode, a first drain electrode, a second source electrode, a second drain electrode, and a first connection metal layer, the first source electrode and the first drain electrode respectively fill the first contact holes and respectively fill the second contact holes communicating with the first contact holes, the second source electrode and the second drain electrode respectively fill the third contact holes, and the first drain electrode and the second source electrode are electrically connected through the first connection metal layer.

In an embodiment, the second contact holes extend from the first interlayer insulating layer to the active layer.

In an embodiment, the first substrate further comprises a first gate metal layer and a first light-shielding layer that are disposed on the substrate. The first gate metal layer is disposed corresponding to the first active layer. The first light-shielding layer is disposed below the first gate metal layer and the first active layer. The first gate metal layer comprises a light-shielding layer connection electrode electrically connected to the first light-shielding layer. In the steps of coating the photoresist layer on the first substrate and patterning the photoresist layer using the halftone mask, a third through hole is formed at a position of the photoresist layer corresponding to the light-shielding layer connection electrode. In the step of etching away the second interlayer insulating layer at positions of the first through holes to form the first contact holes, the second interlayer insulating layer at a position of the third through hole is etched away to form a fourth contact hole exposing the first interlayer insulating layer. In the steps of etching away the first interlayer insulating layer at positions of the first contact holes to form the second contact holes communicating with the first contact holes and etching away the second interlayer insulating layer at positions of the second through holes to form the third contact holes, the first interlayer insulating layer at a position of the fourth contact hole is etched away to form a fifth contact hole exposing the light-shielding layer connection electrode. In the steps of removing the photoresist layer and forming the source/drain metal layer on the second interlayer insulating layer, the source/drain metal layer further comprises a second connection metal layer, wherein the second connection metal layer fills the fourth contact hole and the fifth contact hole communicating with the fourth contact hole, and is electrically connected to the first source electrode.

In an embodiment, the photoresist layer is made of a positive photoresist, and the halftone mask comprises a plurality of light-transmitting regions having a light transmittance of 100%, a plurality of semi-light-transmitting regions having a light transmittance of 40%-70%, and a plurality of non-light-transmitting regions having a light transmittance of 0%.

In an embodiment, the first active layer is made of low-temperature polysilicon, and the second active layer is made of a metal oxide semiconductor material.

Compared with the prior art, by using a half-tone mask and only one photomask process, a method for fabricating an array substrate of the present disclosure forms a plurality of contact holes for electrically connecting a first thin-film transistor and a second thin-film transistor. This reduces photomask processes, improves production efficiency, and reduces costs. In addition, in an array substrate fabricated by the method for fabricating the array substrate of the present disclosure, ports of contact holes of a first source electrode and a first drain electrode have smooth arcs, which can effectively prevent wire breakage caused by holes being too deep.

BRIEF DESCRIPTION OF THE SEVERAL VIEWS OF THE DRAWINGS

In order to more clearly illustrate the technical solutions in the embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

Technical solutions of the present disclosure will be clearly and completely described below in conjunction with accompanying drawings in embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure.

Please refer to FIG. 1(a) to FIG. 1(g), a first embodiment of the present disclosure provides a method for fabricating an array substrate, comprising the following steps.

Figure 1A:
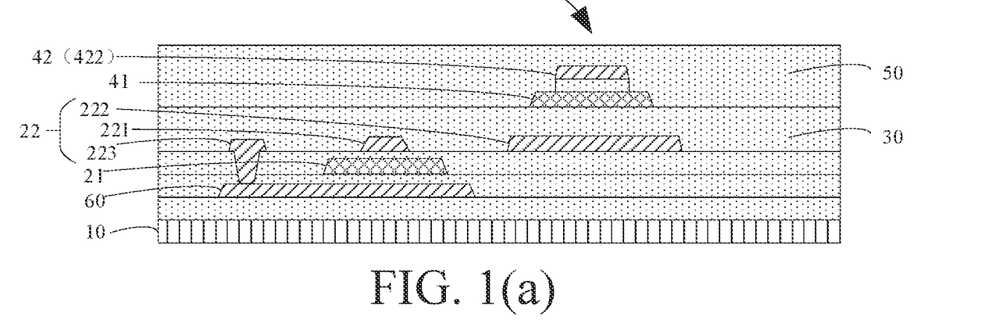
FIG. 1(a), FIG. 1(b), FIG. 1(c), FIG. 1(d), FIG. 1(e), FIG. 1(f) and FIG. 1(g) are schematic flowcharts of a method for fabricating an array substrate according to a first embodiment of the present disclosure.

S1: please refer to FIG. 1(a), providing a first substrate 100a. The first substrate 100a comprises a substrate 10, a first active layer 21, a first gate metal layer 22, a first interlayer insulating layer 30, a second active layer 41, a second gate metal layer 42, and a second interlayer insulating layer 50. The first active layer 21 and the first gate metal layer 22 are disposed on the substrate 10. The first interlayer insulating layer 30 is disposed on the first active layer 21 and the first gate metal layer 22. The second active layer 41 and the second gate metal layer 42 are disposed on the first interlayer insulating layer 30. The second interlayer insulating layer 50 is disposed on the second active layer 41 and the second gate metal layer 42.

The substrate 10 is a transparent substrate, and may be made of a flexible material such as polyimide.

The first active layer 21 is disposed on a side of the first gate metal layer 22 close to the substrate 10. A first gate insulating layer is disposed between the first active layer 21 and the first gate metal layer 22. The second active layer 41 is disposed on a side of the second gate metal layer 42 close to the substrate 10. A second gate insulating layer is disposed between the second active layer 41 and the second gate metal layer 42. Therefore, thin film transistors formed subsequently are bottom-gate thin film transistors. However, in the present disclosure, types of thin film transistors formed subsequently are not limited, and the thin film transistors formed subsequently may be bottom-gate thin film transistors or top-gate thin film transistors. In a top-gate thin film transistor, the first gate metal layer 22 is disposed on a side of the first active layer 21 close to the substrate 10, and the second gate metal layer 42 is disposed on a side of the second active layer 41 close to the substrate 10.

In this embodiment, the first active layer 21 is made of low-temperature polysilicon such as N-type doped low-temperature polysilicon. The second active layer 41 is made of a metal oxide semiconductor material, such as indium gallium zinc oxide (IGZO), indium gallium zinc tin oxide (IGZTO), indium zinc oxide (IZO), gallium indium oxide (IGO), indium gallium zinc oxide (IGZO), indium gallium tin oxide (IGTO), indium zinc tin oxide (IZTO), and indium tin oxide (ITO).

The first gate metal layer 22 comprises a first gate electrode 221, a second light-shielding layer 222, and a light-shielding layer connection electrode 223. The first gate electrode 221 is disposed corresponding to the first active layer 21. The second light-shielding layer 222 and the light-shielding layer connection electrode 223 are disposed on both sides of the first gate electrode 221, respectively.

The second gate metal layer 42 comprises a second gate electrode 422. The second gate electrode 422 is disposed corresponding to the second active layer 41. The second light-shielding layer 222 is configured to shield the second gate electrode 422 from light.

In addition, the first substrate 100a further comprises a first light-shielding layer 60 disposed on the substrate 10. The first light-shielding layer 60 is disposed below the first gate metal layer 22 and the first active layer 21. The light-shielding layer connection electrode 223 is electrically connected to the first light-shielding layer 60 through a through hole penetrating a first gate electrode light-shielding layer and a buffer layer. The first light-shielding layer 60 is configured to shield the first gate electrode 221 from light.

It can be understood that a buffer layer and the like may also be disposed between the substrate 10 and the first light-shielding layer 60.

The first gate metal layer 22, the second gate metal layer 42, and the first light-shielding layer 60 may be made of tantalum (Ta), tungsten (W), molybdenum (Mo), aluminum (Al), titanium (Ti), copper-niobium (Cu—Nb) alloy, or the like, and may also be made of a stack of copper (Cu) and molybdenum (Mo), a stack of copper (Cu) and molybdenum-titanium (Mo—Ti) alloys, a stack of copper (Cu) and titanium (Ti), a stack of aluminum (Al) and molybdenum (Mo), a stack of molybdenum (Mo) and tantalum (Ta), a stack of molybdenum (Mo) and tungsten (W), a stack of molybdenum (Mo)-aluminum (Al)-molybdenum (Mo), or the like.

The first interlayer insulating layer 30, the second interlayer insulating layer 50, the first gate insulating layer, and the second gate insulating layer may be made of SiOx, SiNx, a stack of SiNx and SiOx, or the like.

Figure 1B:
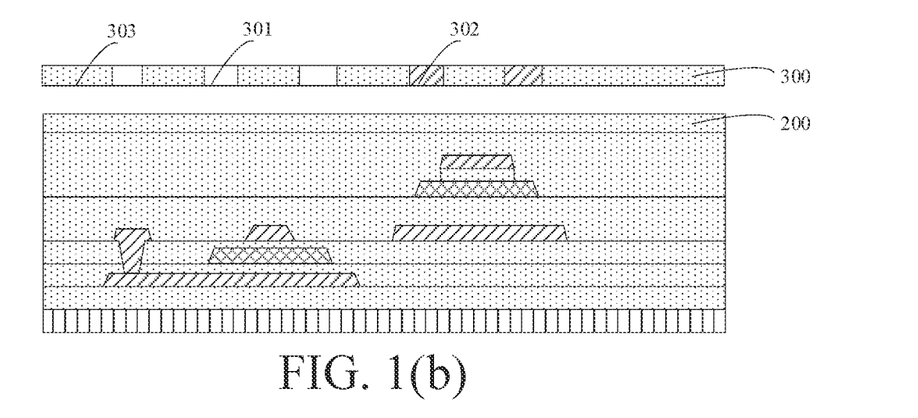
Figure 1C:
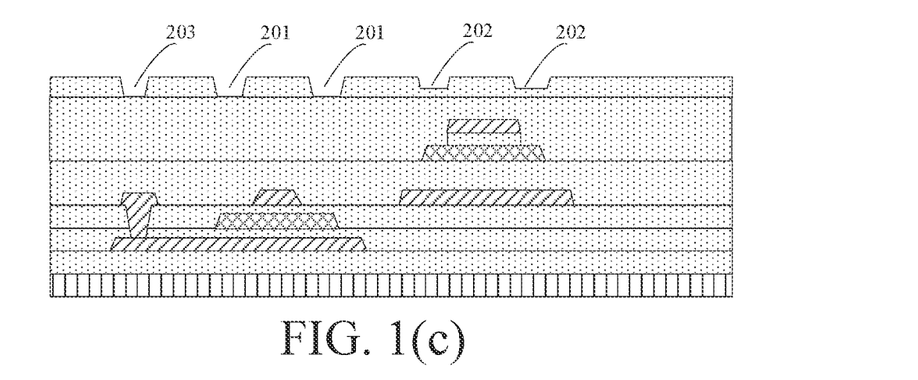

S2: please refer to FIG. 1(b) and FIG. 1(c), coating a photoresist layer 200 on the first substrate 100a, and patterning the photoresist layer 200 using a halftone mask 300. The step of patterning comprises exposing and developing the photoresist layer 200 using the halftone mask 300. By exposing and developing, two first through holes 201 are formed at positions of the photoresist layer 200 corresponding to both sides of the first active layer 21, and two first blind holes 202 are formed at positions of the photoresist layer 200 corresponding to both sides of the second active layer 41. In other words, the two first through holes 201 are formed at positions of the photoresist layer 200 corresponding to predetermined source/drain electrodes on the first active layer 21, and the two first blind holes 202 are formed at positions of the photoresist layer 200 corresponding to predetermined source/drain electrodes on the second active layer 41. A depth of the first blind holes 202 occupies 40%-70% of a thickness of the photoresist layer 300.

In this step, a third through hole 203 is also formed at a position of the photoresist layer 200 corresponding to the light-shielding layer connection electrode 223.

The photoresist layer 200 may be made of a positive photoresist or a negative photoresist. In this embodiment, the photoresist layer 200 is a positive photoresist layer. The halftone mask 300 comprises a plurality of light-transmitting regions 301, a plurality of semi-light-transmitting regions 302, and a plurality of non-light-transmitting regions 303. The light-transmitting regions 301 have a light transmittance of 100%. The semi-light-transmitting regions 302 have a light transmittance of 40%-70%. The non-light-transmitting regions 303 have a light transmittance of 0%.

Figure 1D:
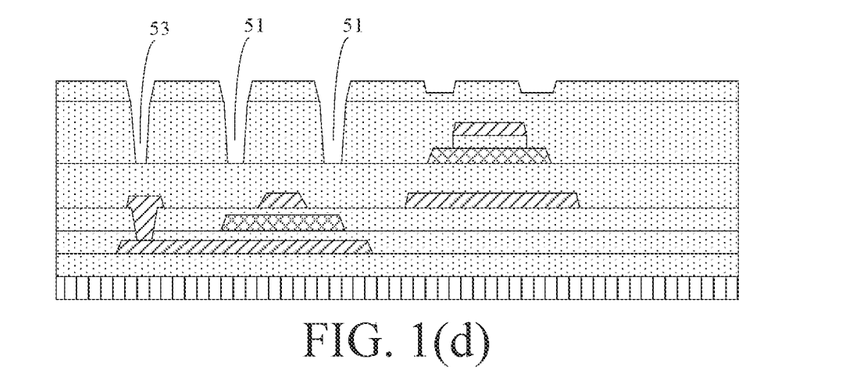

S3: please refer to FIG. 1(c) and FIG. 1(d), etching away the second interlayer insulating layer 50 at positions of the first through holes 201 to form first contact holes 51, and at a position of the third through hole 203 to form a fourth contact hole 53. The first contact holes 51 and the fourth contact hole 53 expose the first interlayer insulating layer 30.

Figure 1E:
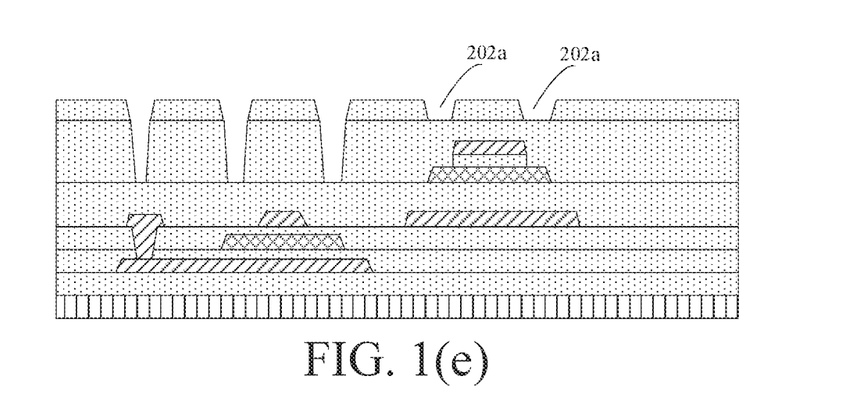

S4: please refer to FIG. 1(d) and FIG. 1(e), ashing the patterned photoresist layer 200, so that the first blind holes 202 form second through holes 202a. The step of ashing uses oxygen or a gas comprising oxygen. The step of ashing thins the photoresist layer 200, so that the first blind holes 202 form the second through holes 202a.

Figure 1F:
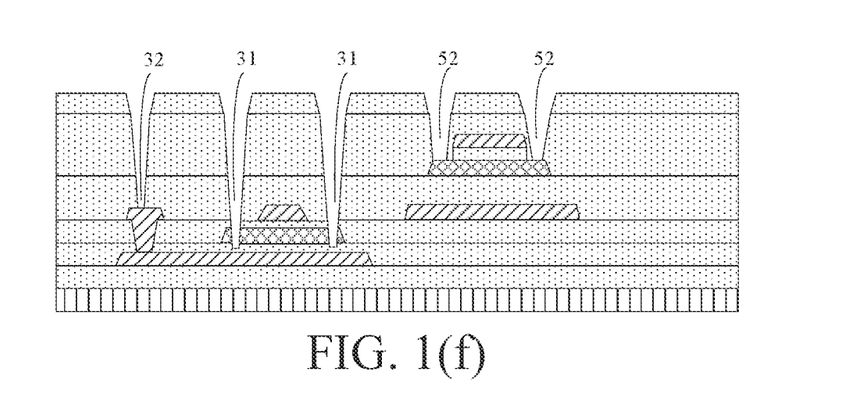

S5: please refer to FIG. 1(f), etching away the first interlayer insulating layer 30 at positions of the first contact holes 51 to form second contact holes 31, etching away the second interlayer insulating layer 50 at positions of the second through holes 202a to form third contact holes 52, and etching away the first interlayer insulating layer 30 at a position of the fourth contact hole 53 to form a fifth contact hole 32. The second contact holes 31 expose the first active layer 21. The third contact holes 52 expose the second active layer 41. The fifth contact hole 32 exposes the light-shielding layer connection electrode 223.

In an embodiment, the second contact holes 31 expose an upper surface of the first active layer 21. In another embodiment, the second contact holes 31 extend from the first interlayer insulating layer 30 to the first active layer 21. The description "extend . . . to the first active layer 21" may be "penetrate a part of the first active layer 21" or "penetrate the first active layer 21". The second contact holes 31 may also penetrate the first active layer 21 and a buffer layer below it, as long as the second contact holes 31 are not short-circuited with the first light-shielding layer 60. In other embodiments of the present disclosure, the second contact holes 31 penetrate the interlayer insulating layer 30 and the first gate insulating layer to expose the first active layer 21.

Figure 1G:
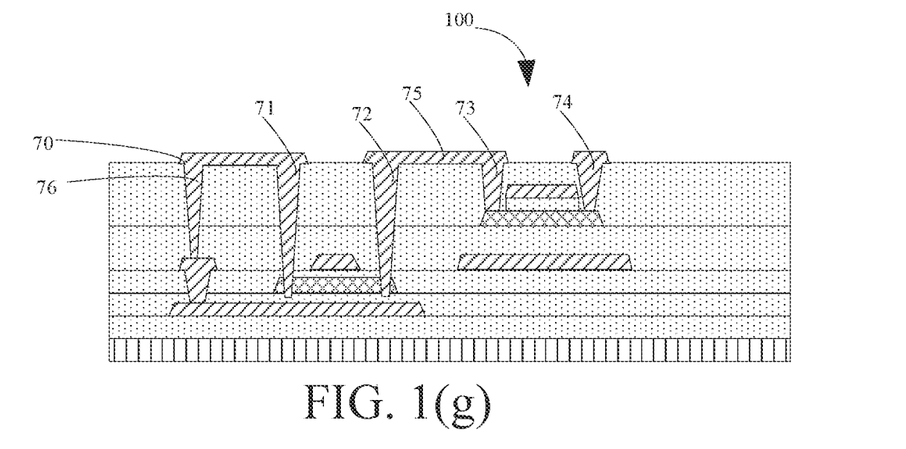

S6: please refer to FIG. 1(g), removing the photoresist layer 200, and forming a source/drain metal layer 70 on the second interlayer insulating layer 50 to form a first thin film transistor T1 and a second thin film transistor T2, thereby obtaining the array substrate 100.

The source/drain metal layer 70 comprises a first source electrode 71, a first drain electrode 72, a second source electrode 73, a second drain electrode 74, a first connection metal layer 75, and a second connection metal layer 76. The first source electrode 71 and the first drain electrode 72 respectively fill the first contact holes 51, and respectively fill the second contact holes 31 communicating with the first contact holes 51. The source/drain metal layer 70 and the first active layer 21 are electrically connected in the second contact holes 31. That is, side contacts. The second source electrode 73 and the second drain electrode 74 respectively fill the third contact holes 52. The first drain electrode 72 and the second source electrode 73 are electrically connected through the first connection metal layer 75. The second connection metal layer 76 fills the fourth contact hole 53 and the fifth contact hole 32 communicating with the fourth contact hole 53, and is electrically connected to the first source electrode 71. The first light-shielding layer 60 is electrically connected to the first source electrode 71 through the light-shielding layer connection electrode 223 and the second connection metal layer 76. Therefore, an electric field caused by ions of layers below low-temperature polysilicon can be shielded, which makes electrical properties of thin film transistors are more stable.

In addition, in the array substrate 100 fabricated by the aforementioned method, the second interlayer insulating layer 50 at an end of the first contact hole 51 away from the first interlayer insulating layer 30 has a first smooth rounded surface 51a, and the first interlayer insulating layer 30 at an end of the second contact hole 31 close to the second interlayer insulating layer 50 has a second smooth rounded surface 31a. The first smooth rounded surface 51a and the second smooth rounded surface 30a have smooth arcs instead of obtuse angle shapes formed by the two etchings. When the source/drain metal layer 70 covers the first contact hole 51 and the second contact hole 31, these smooth arcs can effectively prevent wire breakage caused by holes being too deep.

In other embodiments of the present disclosure, the array substrate 100 further comprises a third active layer disposed on the second interlayer insulating layer, and a fourth interlayer insulating layer disposed on the third active layer. In order to electrically connect the second active layer 41 and the third active layer, the array substrate 100 can be fabricated in the same manner. Specifically, a second semi-light-transmitting region is added to the halftone mask 300. A light transmittance of the semi-light-transmitting region is less than that of the semi-light-transmitting region 302. Through the above steps of etching, ashing, and etching, contact holes between the second active layer 41 and the third active layer can be obtained. The second active layer 41 and the third active layer can be electrically connected through the source/drain metal layer 70. In other embodiments of the present disclosure, materials of the first active layer 21 and the second active layer 41 are not limited. As long as the array substrate 100 has the first active layer 21 and the second active layer 41 in different layers, the method for fabricating the array substrate of the present disclosure can be used to connect the first thin film transistor T1 and the second thin film transistor T2.

Figure 2:
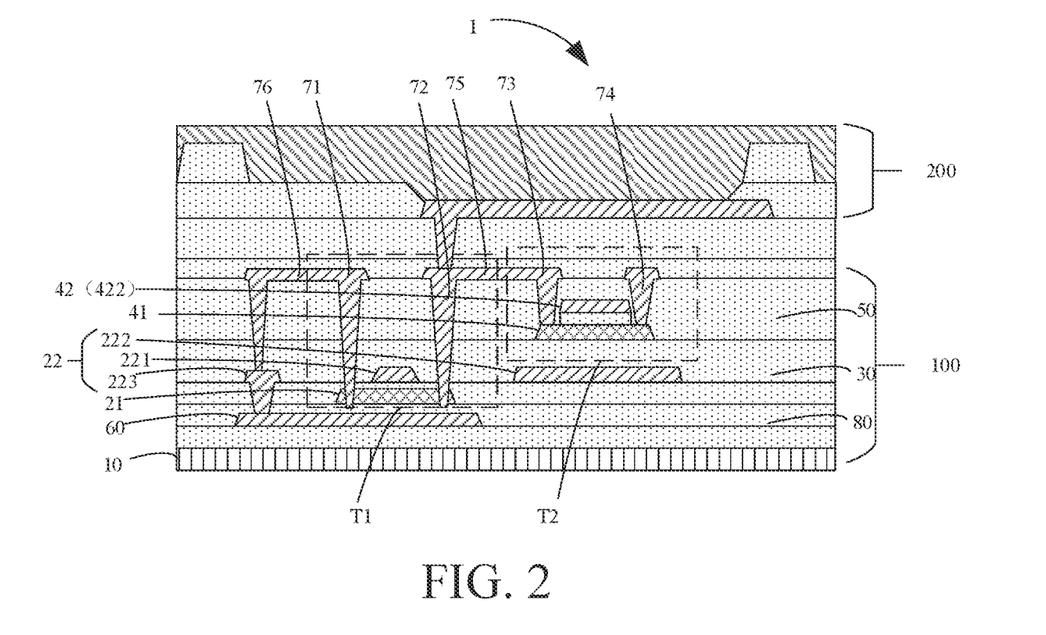
FIG. 2 is a schematic cross-sectional view of a display panel according to a second embodiment of the present disclosure.
Figure 3:
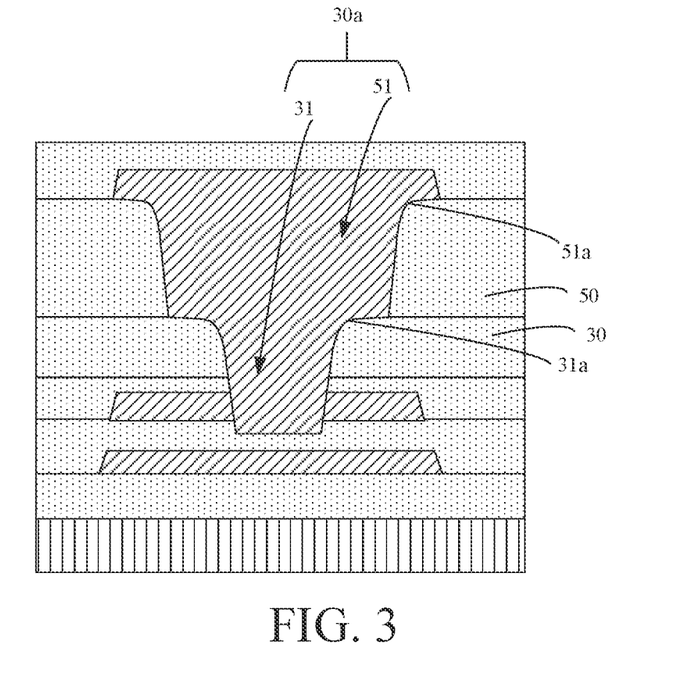
FIG. 3 is a schematic diagram of contact holes of the display panel of FIG. 2.

Please refer to FIG. 2 and FIG. 3, a second embodiment of the present disclosure further provides a display panel 1 comprising an array substrate 100 and a plurality of light emitting portions 400 disposed on the array substrate 100.

The array substrate 100 can be fabricated by the method of the first embodiment.

The array substrate 100 comprises a substrate 10, a first thin film transistor T1, and a second thin film transistor T2. The first thin film transistor T1 and the second thin film transistor T2 are disposed on the substrate 10. The first thin film transistor T1 is disposed on a side of the second thin film transistor T2 close to the substrate 10.

The substrate 10 is a transparent substrate, and may be made of a flexible material such as polyimide.

The first thin film transistor T1 comprises a first gate electrode 221, a first active layer 21, a first source electrode 71, a first drain electrode 72, and a first interlayer insulating layer 30. The first active layer 21 is disposed corresponding to the first gate electrode 221. A first gate insulating layer is further disposed between the first gate electrode 221 and the first active layer 21. The first source electrode 71 and the first drain electrode 72 are disposed at both sides of the first active layer 21 and are electrically connected to the first active layer 21. The first interlayer insulating layer 30 is disposed between the first active layer 21 and the first source 71, and between the first active layer 21 and the first drain 72. Step-shaped contact holes 30a are disposed in the first interlayer insulating layer 30. The first source electrode 71 and the first drain electrode 72 are respectively filled in the contact holes 30a and electrically connected to the first active layer 21. Each of the contact holes 30a is composed of a first contact hole 51 and a second contact hole 31 that communicate with each other. The first contact hole 51 is disposed on a side of the second contact hole 31 away from the first active layer 21. A diameter of the first contact hole 51 is greater than that of the second contact hole 31.

Please refer to FIG. 1(a) to FIG. 1(g), the first contact holes 51 are formed in a second interlayer insulating layer 50 at positions corresponding to both sides of the first active layer 21. The second contact holes 31 are formed in the first interlayer insulating layer 30. The second contact holes 31 expose the first active layer 21.

In an embodiment, the second contact holes 31 extend to the first active layer 21. The first source electrode 71 and the first drain electrode 72 respectively fill the first contact holes 51, and respectively fill the second contact holes 31 communicating with the first contact holes 51. The source/drain metal layer 70 and the first active layer 21 are electrically connected in the second contact holes 31. That is, side contacts.

The first contact hole 51 has a first smooth rounded surface 51a at its end away from the first active layer 21. The second contact hole 31 has a second smooth rounded surface 31a at its end away from the first active layer 21. The first smooth rounded surface 51a and the second smooth rounded surface 31a have smooth arcs instead of obtuse angle shapes formed by the two etchings. When the source/drain metal layer 70 covers the first contact hole 51 and the second contact hole 31, these smooth arcs can effectively prevent wire breakage caused by holes being too deep.

In an embodiment, the array substrate 100 further comprises a first light-shielding layer 60 disposed between the substrate 10 and the first thin film transistor T1, and a buffer layer 80 disposed between the first light-shielding layer 60 and the first active layer 21. The first light-shielding layer 60 is configured to shield the first gate electrode 221 from light. The second contact holes 31 extend through the first active layer 21 into the buffer layer 80. The first source electrode 71 and the first light-shielding layer 60 are electrically connected through a second connection metal layer 76. The array substrate 100 further comprises a light-shielding layer connection electrode 223 disposed on a same layer as the first gate electrode 221. The first light-shielding layer 60 is electrically connected to the first source electrode 71 through the light-shielding layer connection electrode 223 and the second connection metal layer 76. Therefore, an electric field caused by ions of layers below low-temperature polysilicon can be shielded, which makes electrical properties of thin film transistors are more stable.

The second thin film transistor T2 is disposed on the first interlayer insulating layer 30. The second thin film transistor T2 comprises a second gate electrode 422, a second active layer 41, a second source electrode 73, a second drain electrode 74, and the second interlayer insulating layer 50. The second gate electrode 422 is disposed corresponding to the second active layer 421 and on a side of the second active layer 41 away from the substrate 10. A second gate insulating layer is further disposed between the second gate electrode 422 and the second active layer 41. The second source electrode 73 and the second drain electrode 74 are disposed at both sides of the second active layer 41 and electrically connected to the second active layer 41. The second interlayer insulating layer 50 is disposed between the second active layer 41 and the first source electrode 73, and between the second active layer 41 and the first drain electrode 74. The first drain electrode 72 and the second source electrode 73 are electrically connected through a first connection metal layer 75.

The array substrate 100 may further comprise a second light-shielding layer 222 between the second thin film transistor T2 and the substrate 10. The second light-shielding layer 222 is configured to shield the second gate electrode 422 from light. The second light-shielding layer 222 and the light-shielding layer connection electrode 223 are disposed on both sides of the first gate electrode 221, respectively.

Please refer to FIG. 1(a) to FIG. 1(g), third contact holes 52 are formed at positions of the second interlayer insulating layer 50 corresponding to both sides of the second active layer 41. The third contact holes 52 expose the second active layer 41. A fourth contact hole 53 is formed at a position of the second interlayer insulating layer 50 corresponding to the light-shielding layer connection electrode 223. The fourth contact hole 53 exposes the first interlayer insulating layer 30. A fifth contact hole 32 is formed at a position of the first interlayer insulating layer 30 corresponding to the fourth contact hole 53. The fifth contact hole 32 exposes the light-shielding layer connection electrode 223. The fourth contact hole 53 communicates with the fifth contact hole 32. The second source electrode 73 and the second drain electrode 74 respectively fill the third contact holes 52. The second connection metal layer 76 fills the fourth contact hole 53 and the fifth contact hole 32 communicating with the fourth contact hole 53, and is electrically connected to the first source electrode 71.

The first active layer 21 is disposed on a side of the first gate electrode 221 close to the substrate 10. The second active layer 41 is disposed on a side of the second gate electrode 422 close to the substrate 10. That is, the first thin film transistor T1 and the second thin film transistor T2 of this embodiment are both bottom-gate thin film transistors. However, in the present disclosure, types of thin film transistors formed subsequently are not limited, and the thin film transistors formed subsequently may be bottom-gate thin film transistors or top-gate thin film transistors. In this embodiment, the first active layer 21 is made of low-temperature polysilicon such as N-type doped low-temperature polysilicon. The second active layer 41 is made of a metal oxide semiconductor material, such as indium gallium zinc oxide (IGZO), indium gallium zinc tin oxide (IGZTO), indium zinc oxide (IZO), gallium indium oxide (IGO), indium gallium zinc oxide (IGZO), indium gallium tin oxide (IGTO), indium zinc tin oxide (IZTO), and indium tin oxide (ITO).

The light emitting portions 400 may be arranged in an array. The light emitting portions 400 may be, for example, organic light emitting diode light emitting portions, micro light emitting diode chips, or the like. Each of the organic light emitting diode light emitting portions may comprise an anode layer disposed on a driving circuit layer, and a hole injection layer, a hole transport layer, an electron transport layer, an organic light emitting material layer, an electron transport layer, an electron injection layer, and a cathode layer sequentially stacked on the anode layer. The anode layer is electrically connected to the first drain electrode 71.

Compared with the prior art, by using a half-tone mask and only one photomask process, a method for fabricating an array substrate of the present disclosure forms a plurality of contact holes for electrically connecting a first thin-film transistor and a second thin-film transistor. This reduces photomask processes, improves production efficiency, and reduces costs. In addition, in an array substrate fabricated by the method for fabricating the array substrate of the present disclosure, ports of contact holes of a first source electrode and a first drain electrode have smooth arcs, which can effectively prevent wire breakage caused by holes being too deep.

The embodiments of the present disclosure are described in detail above. The present disclosure uses specific examples to describe principles and embodiments of the present invention. The above description of the embodiments is only for helping to understand the present invention. Furthermore, those skilled in the art may make modifications to the specific embodiments and applications according to ideas of the present invention. In conclusion, the present specification should not be construed as a limitation to the present invention.

What is claimed is:

1. A method for fabricating an array substrate for a display panel, comprising:
providing a first substrate comprising a substrate, a first active layer, a first interlayer insulating layer, a second active layer, and a second interlayer insulating layer, wherein the first active layer and the second active layer are disposed on the substrate, the second active layer is disposed on a side of the first active layer away from the substrate, the first interlayer insulating layer is disposed between the first active layer and the second active layer, and the second interlayer insulating layer is disposed on the second active layer;

coating a photoresist layer on the first substrate;

patterning the photoresist layer using a halftone mask, wherein two first through holes are formed at positions of the photoresist layer corresponding to both sides of the first active layer, and two first blind holes are formed at positions of the photoresist layer corresponding to both sides of the second active layer;

etching away the second interlayer insulating layer at positions of the first through holes to form first contact holes exposing the first interlayer insulating layer;

ashing the patterned photoresist layer, so that the first blind holes form second through holes;

etching away the first interlayer insulating layer at positions of the first contact holes to form second contact holes communicating with the first contact holes and extending in or through the first active layer;

etching away the second interlayer insulating layer at positions of the second through holes to form third contact holes exposing the second active layer;

removing the photoresist layer; and forming a source/drain metal layer on the second interlayer insulating layer, wherein the source/drain metal layer comprises a first source electrode, a first drain electrode, a second source electrode, a second drain electrode, and a first connection metal layer, the first source electrode and the first drain electrode respectively fill the first contact holes, respectively fill the second contact holes communicating with the first contact holes, and extend in or through and contact the first active layer such that the first source electrode and the first drain electrode are electrically connected to the first active layer, the second source electrode and the second drain electrode respectively fill the third contact holes, and the first drain electrode and the second source electrode are electrically connected through the first connection metal layer.

2. The method for fabricating the array substrate for a display panel according to claim 1, wherein the first contact hole has a first smooth rounded surface at its end away from the first active layer.

3. The method for fabricating the array substrate for a display panel according to claim 1, wherein the third contact holes are formed at positions of the second interlayer insulating layer corresponding to both sides of the second active layer and expose the second active layer, and the second source electrode and the second drain electrode are filled in the third contact holes.

4. The method for fabricating the array substrate for a display panel according to claim 1, wherein the second contact holes extend from the first interlayer insulating layer to the active layer.

5. The method for fabricating the array substrate for a display panel according to claim 1, wherein:

the first substrate further comprises a first gate metal layer and a first light-shielding layer that are disposed on the substrate, the first gate metal layer is disposed corresponding to the first active layer, the first light-shielding layer is disposed below the first gate metal layer and the first active layer, the first gate metal layer comprises a light-shielding layer connection electrode electrically connected to the first light-shielding layer;

in the steps of coating the photoresist layer on the first substrate and patterning the photoresist layer using the halftone mask, a third through hole is formed at a position of the photoresist layer corresponding to the light-shielding layer connection electrode;

in the step of etching away the second interlayer insulating layer at positions of the first through holes to form the first contact holes, the second interlayer insulating layer at a position of the third through hole is etched away to form a fourth contact hole exposing the first interlayer insulating layer;

in the steps of etching away the first interlayer insulating layer at positions of the first contact holes to form the second contact holes communicating with the first contact holes and etching away the second interlayer insulating layer at positions of the second through holes to form the third contact holes, the first interlayer insulating layer at a position of the fourth contact hole is etched away to form a fifth contact hole exposing the light-shielding layer connection electrode; and in the steps of removing the photoresist layer and forming the source/drain metal layer on the second interlayer insulating layer, the source/drain metal layer further comprises a second connection metal layer, wherein the second connection metal layer fills the fourth contact hole and the fifth contact hole communicating with the fourth contact hole, and is electrically connected to the first source electrode.

6. The method for fabricating the array substrate for a display panel according to claim 1, wherein the second contact hole has a second smooth rounded surface at its end away from the first active layer.

7. The method for fabricating the array substrate for a display panel according to claim 6, wherein the photoresist layer is made of a positive photoresist, and the halftone mask comprises:

a plurality of light-transmitting regions having a light transmittance of 100%;

a plurality of semi-light-transmitting regions having a light transmittance of 40%-70%; and a plurality of non-light-transmitting regions having a light transmittance of 0%.

8. The method for fabricating the array substrate for a display panel according to claim 1, wherein the first active layer is made of low-temperature polysilicon, and the second active layer is made of a metal oxide semiconductor material.

* * * * *